(12) United States Patent
Yoo et al.

(10) Patent No.: US 7,608,541 B2
(45) Date of Patent: Oct. 27, 2009

(54) METHOD OF FORMING FINE PATTERN, LIQUID CRYSTAL DISPLAY DEVICE HAVING A FINE PATTERN AND FABRICATING METHOD THEREOF

(75) Inventors: Soon Sung Yoo, Gyeonggi-do (KR); Heung Lyul Cho, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 399 days.

(21) Appl. No.: 11/451,482

(22) Filed: Jun. 13, 2006

(65) Prior Publication Data

US 2007/0001961 A1 Jan. 4, 2007

(30) Foreign Application Priority Data

Jun. 30, 2005 (KR) ...................... 10-2005-0058421

(51) Int. Cl.
*H01L 21/302* (2006.01)

(52) U.S. Cl. ............................. 438/689; 257/E21.039
(58) Field of Classification Search ................ 438/689; 257/E21.039
See application file for complete search history.

(56) References Cited

U.S. PATENT DOCUMENTS

| 6,514,672 | B2 * | 2/2003 | Young et al. ................. 430/314 |
| 6,620,690 | B2 * | 9/2003 | Lee et al. ...................... 438/268 |
| 2002/0090827 | A1 * | 7/2002 | Yokoshima ................. 438/714 |

* cited by examiner

*Primary Examiner*—David S Blum
(74) *Attorney, Agent, or Firm*—Holland & Knight LLP

(57) ABSTRACT

A method of forming fine pattern includes providing a film, forming a photo-resist pattern on the film, ashing the photo-resist pattern and patterning the film by using the ashed photo-resist pattern as a mask.

32 Claims, 16 Drawing Sheets

METHOD OF FORMING FINE PATTERN, LIQUID CRYSTAL DISPLAY DEVICE HAVING A FINE PATTERN AND FABRICATING METHOD THEREOF

This application claims the benefit of Korean Patent Application No. P2005-0058421 filed in Korea on Jun. 30, 2005, which is hereby incorporated by reference in its entirety.

BACKGROUND OF THE INVENTION

1. Field of the Invention

This invention relates to a fine pattern, and more particularly to a method of forming a fine pattern, a liquid crystal display device having a fine pattern and a fabricating method thereof.

2. Description of the Related Art

In general, a liquid crystal display (LCD) device controls light transmittance of a liquid crystal having dielectric anisotropy using an electric field, to thereby display a picture. The LCD device includes a liquid crystal display panel for displaying a picture with a liquid crystal cell matrix, and a driving circuit for driving the liquid crystal display panel. A switching device is formed in each of the cell areas in the liquid crystal matrix. An LCD device is used as a display in televisions, computer monitors, office equipment, and cellular phones.

FIG. 1 is a schematic perspective view showing a structure of a related art liquid crystal display panel. Referring to FIG. 1, the related art liquid crystal display panel includes a color filter substrate 10 and the thin film transistor substrate 20 that are attached to each other with liquid crystal molecules 24 therebetween. The liquid crystal molecules 24 are long and thin.

The color filter substrate 10 includes a black matrix 4, a color filter 6 and a common electrode 8 that are sequentially provided on an upper glass substrate 2. The black matrix 4 is provided on the upper glass substrate 2. The black matrix 4 defines cell areas on the upper glass substrate 2 into a plurality of cell areas that are later provided with color filters 6, and prevents light interference between adjacent cell areas and reflection of external light. The color filters 6 are provided in the cell areas defined by the black matrix 4 in such a manner as to have red (R), green (G) and blue (B) color filters, thereby transmitting red, green and blue lights. The common electrode 8 is formed of a transparent conductive layer coated over the color filter 6. The common electrode 8 supplies a common voltage Vcom that serves as a reference voltage during the driving of the liquid crystal molecules 24. Further, an over-coat layer (not shown) for providing a smooth surface above the color filter 6 may be provided between the color filter 6 and the common electrode 8.

The thin film transistor substrate 20 includes a pixel electrode 22 for each cell area on a lower glass substrate 12 and a thin film transistor 18 at each crossing of a gate line 14 and a data line 16 for each cell area on the lower glass substrate 12. The thin film transistor 18 applies a data signal from the data line 16 to the pixel electrode 22 in response to a gate signal from the gate line 14. The pixel electrode 22 is formed of a transparent conductive layer that receives a data signal from the thin film transistor 18 to drive the liquid crystal molecules 24.

The liquid crystal molecules 24 have a dielectric anisotropy and thus are rotated in accordance with an electric field generated by a data signal from a pixel electrode 22 and a common voltage Vcom from the common electrode 8 to control light transmittance through the liquid crystal molecules 24. Different electric field potentials implement different levels of gray scale. Further, the liquid crystal display panel includes an alignment film for initially aligning the liquid crystal molecules 24, and a spacer (not shown) for maintaining a cell gap between the color filter substrate 10 and the thin film transistor substrate 20.

The color filter substrate 10 and the thin film transistor substrate 20 of a liquid crystal display panel are formed by a plurality of mask processes. Each mask process includes a plurality of sub-processes, such as thin film deposition (coating), cleaning, photolithography, etching, photo-resist stripping and inspection processes. Since the thin film transistor substrate is manufactured by a semiconductor process and a plurality of mask processes, fabrication processes are major cost in the manufacture of a liquid crystal display panel. Therefore, a manufacturing process for the thin film transistor substrate has been developed to reduce the number of mask processes from the five-round mask processes that are the standard number of mask processes for fabricating a thin film transistor substrate.

Liquid crystal display devices can be classified as either a vertical electric field type in which a vertical direction electric field extends between the color filter and the thin film transistor substrates or a horizontal electric field type is which a horizontal direction electric field extends across the surface of one of the two substrates. The vertical electric field type liquid crystal display device can drive a liquid crystal of TN (twisted nematic) mode with a vertical electric field between a common electrode on an upper substrate and a pixel electrode on a lower substrate. The vertical electric field type liquid crystal display device has an advantage in that the aperture ratio is high, but on the other hand, it has a disadvantage in that the viewing angle is narrow, about 90°.

The horizontal electric field type liquid crystal display device drives a liquid crystal of IPS (in-plane switch) mode with a horizontal electric field between a pixel electrode and a common electrode, which are formed in parallel on the thin film transistor substrate. The horizontal electric field type liquid crystal display device has an advantage in that the viewing angle is wide, about 160°, but on the other hand, it has a disadvantage in that the aperture ratio is low. In the liquid crystal display device of horizontal electric field applying type, the pixel electrode and the common electrode are formed of a plurality of finger in each cell area, so that the liquid crystal display device of horizontal electric field applying type has a drawback of a small aperture ratio. A line width of the pixel electrode and the common electrode must be decreased to increase the aperture ratio, but the line width is limited by an exposure resolution of the photolithography process.

FIG. 2A to FIG. 2C are cross-sectional views showing a method of forming a related art electrode. As shown in FIG. 2A, a conductive layer 42 is formed on a substrate 40, and a photo-resist pattern 44 is formed on the conductive layer 42. The photo-resist pattern 44 is formed by a development process and a firing process after a pattern of a mask is transposed onto a photo-resist by an exposure process. The minimum line width of the photo-resist pattern 44 can not be narrower than the exposure resolution of an exposure apparatus. For example, when a photo resolution of a scan type exposure apparatus is approximately 4 µm, the minimum line width of the photo-resist pattern 44 can not be much narrower than 4 µm.

Referring to FIGS. 2B and 2C, the conductive layer 42 is etched by an etching process, thereby providing an electrode 46 overlapped by the photo-resist pattern 44, and then the photo-resist pattern 44 is removed by a stripping process. In this case, the conductive layer 42 is over-etched due to the characteristics of a wet-etching process so that the electrode 46 has a narrower line width than the photo-resist pattern 44. However, when the minimum line width of the photo-resist pattern 44 is about 4 μm, the line width of the electrode 46 can not be less than 3 μm.

The minimum line width of the pixel electrode or the common electrode of the liquid crystal display device of horizontal electric field type is limited by the exposure resolution of an exposure apparatus. The minimum line width can be somewhat reduced by over-etching. However, there is limit as to how much an aperture ratio can be improved by reducing the line width of the pixel electrodes and the common electrodes.

SUMMARY OF THE INVENTION

Accordingly, the present invention is directed to a method of forming a fine pattern, a liquid crystal display device having a fine pattern and a fabricating method thereof that substantially obviate one or more of the problems due to limitations and disadvantages of the related art.

An object of the present invention to provide a method of forming fine pattern that is adaptive for forming a fine pattern not limited by exposure resolution for a liquid crystal display device and a fabricating method thereof.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a method of forming fine pattern includes providing a thin film, forming a photo-resist pattern on a film, ashing the photo-resist pattern, and patterning the film by using the ashed photo-resist pattern as a mask.

In another aspect, a method of forming a fine pattern includes forming a photo-resist pattern using a mask to form a first pattern having a first line width corresponding to an exposure resolution of the mask, ashing the photo-resist pattern to have a second pattern with a second line width narrower than the first line width, and patterning a film by using the ashed photo-resist pattern as a mask to form a third pattern with a third line width narrower than the second line width.

In another aspect, a liquid crystal display device includes a data line crossing a gate line to define a cell area, a thin film transistor connected to the gate line and the data line, a pixel electrode connected to the thin film transistor in the pixel area, a common electrode for forming a horizontal electric field along with the pixel electrode, and a common line connected to the common electrode, wherein at least one of the pixel electrode and the common electrode has a line width less than 3 μm.

In another aspect, a method of fabricating a at least one portion of the pixel electrode and the common electrode on a substrate for a liquid crystal display device includes forming a conductive layer, forming a photo-resist pattern using a mask to form a first pattern having a first line width corresponding to an exposure resolution of the mask, ashing the photo-resist pattern; and patterning the conductive layer using the ashed photo-resist pattern as a mask to form the one portion having a second line width narrower than the first line width.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENTS

Reference will now be made in detail to the preferred embodiments of the present invention, examples of which are illustrated in the accompanying drawings of FIG. 3A to FIG. 7B.

Figure 1:
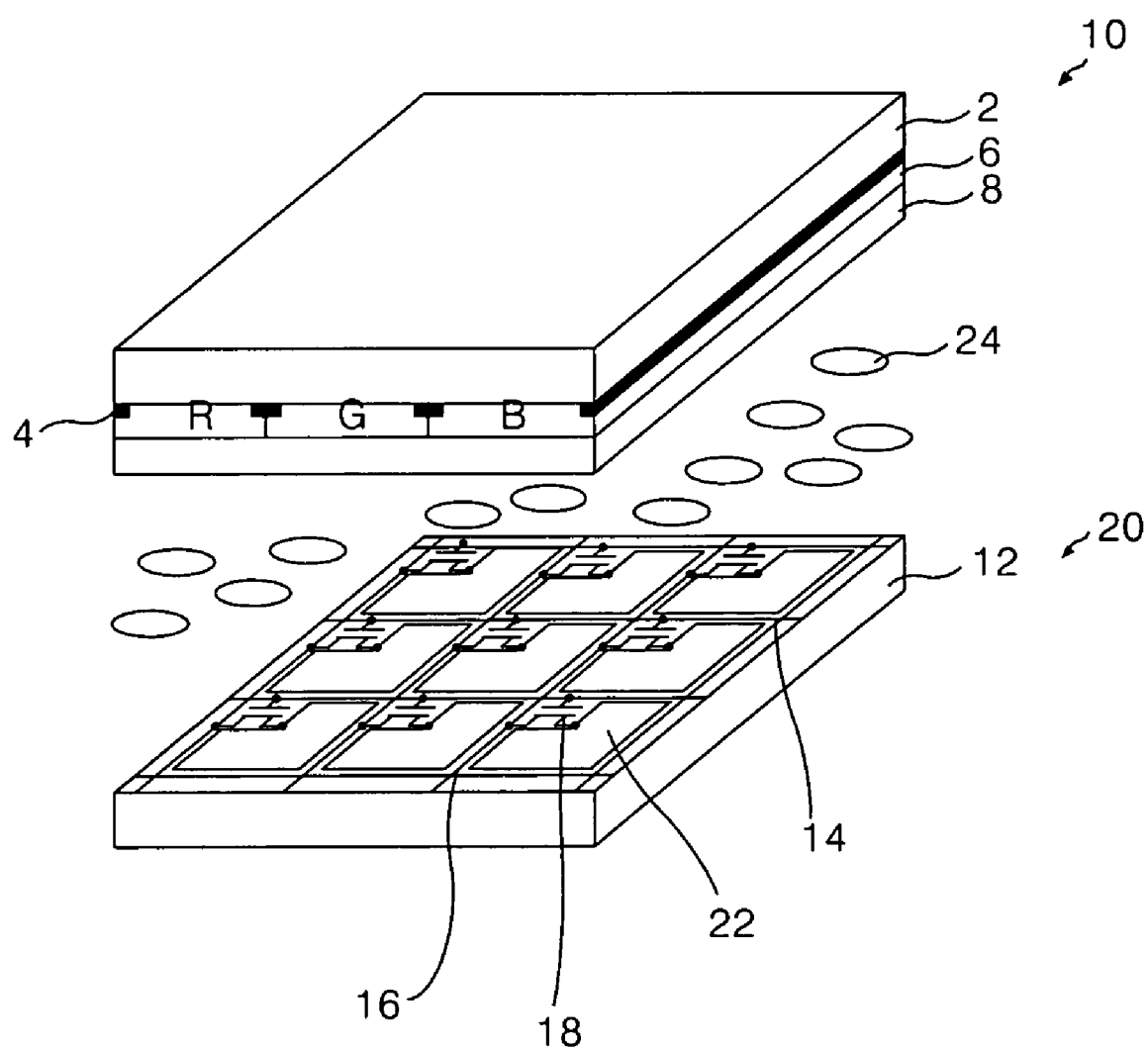
FIG. 1 is a schematic perspective view showing a structure of a related art liquid crystal display panel.
Figure 2A:
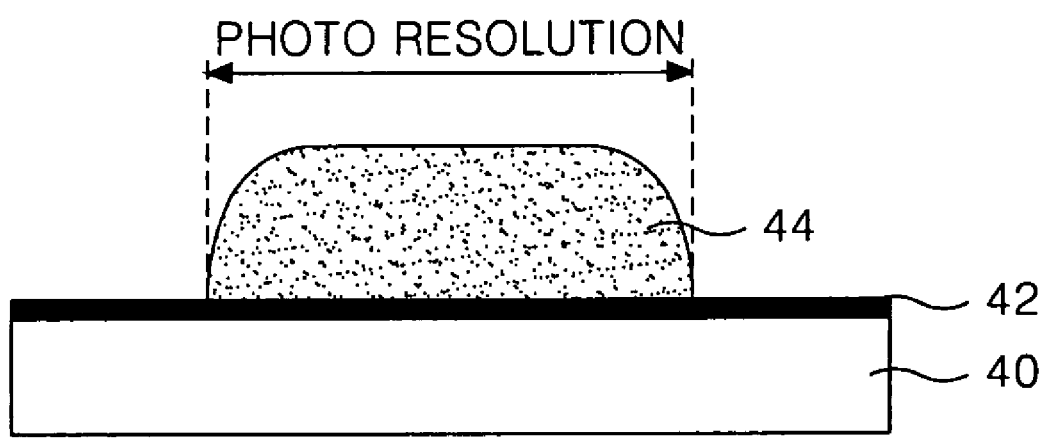
FIG. 2A to FIG. 2C are cross-sectional views showing a method of forming a related art pattern.
Figure 2B:
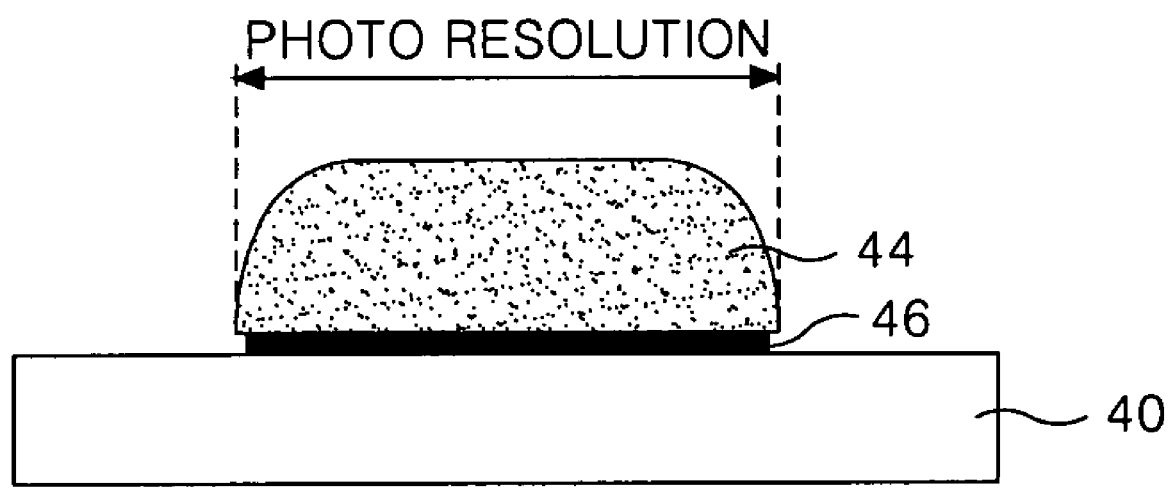
Figure 2C:
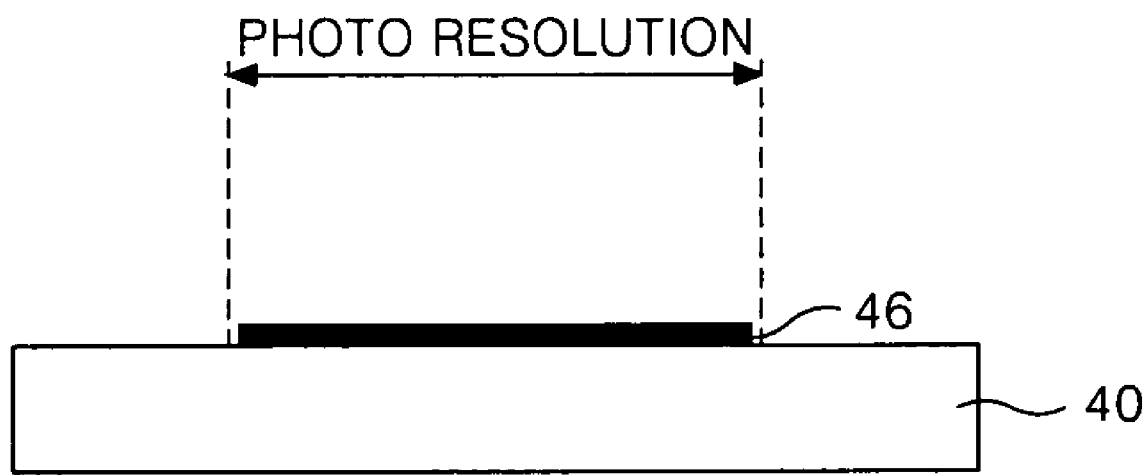
Figure 3A:
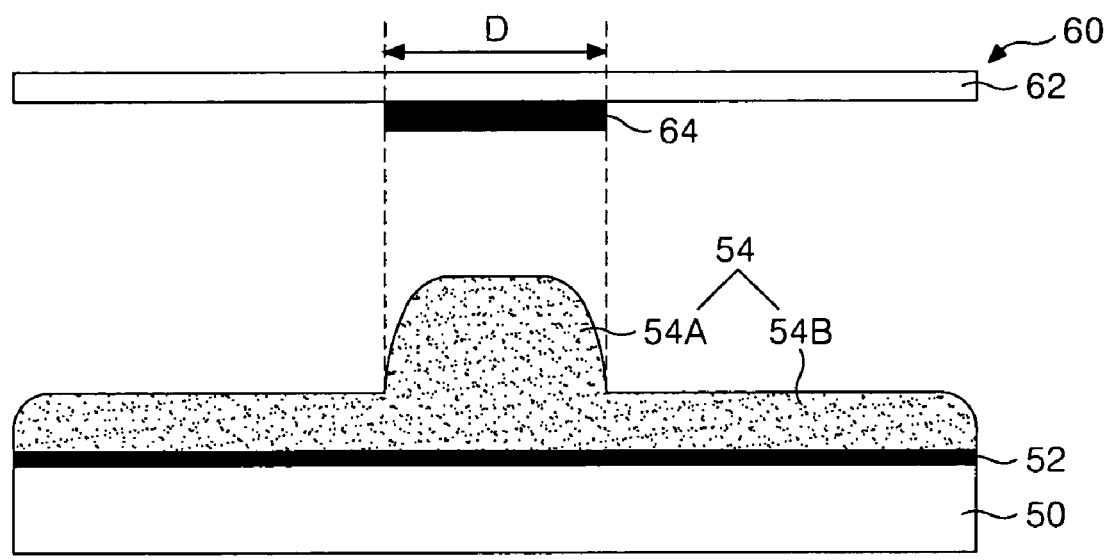
FIG. 3A to FIG. 3D are cross-sectional views showing a method of forming a fine pattern according to an embodiment of the present invention.

FIG. 3A to FIG. 3D are cross-sectional views showing a method of forming a fine pattern according to an embodiment of the present invention. As shown in FIG. 3A, a thin film 52 is formed on a substrate 50, and then a photo-resist pattern 54 is formed on the thin film 52. More specifically, a photo-resist is developed and baked (or hardened) after a photo-resist is formed on the thin film 52, and a shielding area 64 on a mask 60 is transposed onto the photo-resist by an exposure process. The exposure time is reduced such that the photo-resist pattern 54 is formed over the entire thin film layer 52, as shown in FIG. 3A.

The photo-resist pattern 54 has a step pattern, i.e., a step coverage with a step area 54A having a step shape corresponding to the shielding pattern 64 of the mask 60, and a flat area 54B having a flat surface corresponding to the transmitting portion of a mask substrate 62. Typically, a positive type photo-resist is completely removed by an exposure, but the photo-resist pattern 54 remains in the flat area 54B corresponding to the transmitting portion of a mask substrate 62 since the exposure time in embodiments of the present invention is reduced. In other words, exposure time is shortened such that exposure of the flat area 54B is reduced, thereby providing the photo-resist pattern 54 having the step area 54A corresponding to the shielding area, and the flat area 54B having a thickness thinner than that of the first area 54A. Accordingly, productivity is improved by shortening the exposure time.

The photo-resist pattern 54 having a step pattern, i.e., a step coverage may be formed by employing a half tone mask or a diffractive exposure mask. But, since the half tone mask and the diffractive exposure mask are expensive, a related art mask 60 is employed with a reduced exposure time for less cost. The step area 54A of the photo-resist pattern 54 is for forming a fine pattern, and the flat area 54B is additionally formed to provide or maintain the line width uniformity of the step area 54A in a later ashing process. Since the step area 54A of the photo-resist 54 corresponding to the shielding area 64 shown in FIG. 3A is for forming the fine pattern, the minimum line width corresponds to the resolution D of the shielding area 64 on the mask 60.

Figure 3B:
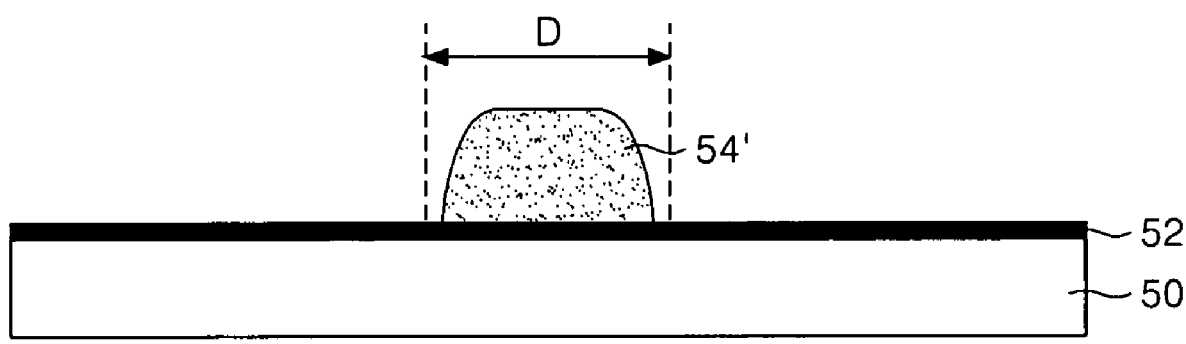

Referring to FIG. 3B, the photo-resist pattern 54 is ashed by an ashing process, thereby removing the flat area 54B of the photo-resist pattern 54, and reducing both the thickness and the line width of the step area 54A of the photo-resist pattern 54. The ashing process condition is controlled on the basis that the second area 54B is completely ashed, thereby maintaining the line width uniformity of the leftover ashed photo-resist pattern 54'. Plasma can be used in the ashing process, and if a related art vacuum method is employed, an ashing gas of $SF_6$ and $CF_4$ together with $O_2$ are used. The remaining ashed photo-resist pattern 54' is formed in such a manner as to have a line width narrower than the exposure resolution D as a result of the ashing process.

Figure 3C:
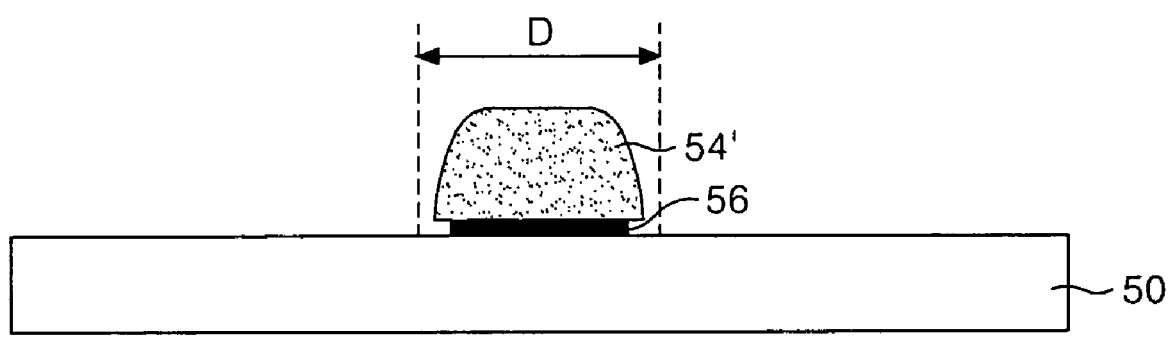
Figure 3D:
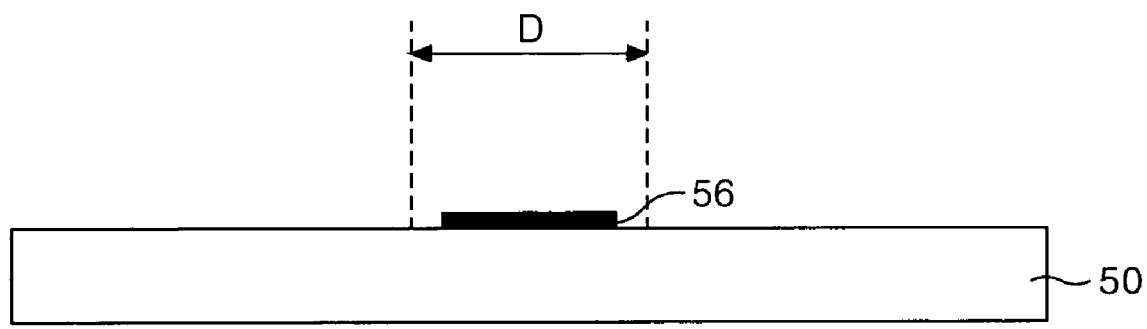

Referring to FIG. 3C and FIG. 3D, the thin film 52 is etched using the ashed photo-resist pattern 54' as a mask to form a thin film pattern 56, and then the remaining ashed photo-resist pattern 54' is removed by a stripping process. In this case, the thin film 52 is over-etched, so that the thin film pattern 56 has a line width narrower than that of the ashed photo-resist pattern 54'. In other words, the ashed photo-resist pattern 54' is formed in such a manner as to have a narrower line width than the exposure resolution D, and the over-etched thin film pattern 56 is formed in such a manner as to have a line width narrower than the ashed photo-resist pattern 54'.

As described above, the ashed photo-resist pattern 54' having a line width narrower than the exposure resolution D is formed by an ashing process of the photo-resist pattern 54. For example, if the exposure resolution D is approximately 3~4 μm, a pattern having a line width of less than 3 μm, such as approximately 0.5~2 μm, can be formed by the method of forming fine pattern in embodiments of the present invention. When such a method of forming a fine pattern is adopted in forming an electrode of a liquid crystal display device of a horizontal electric field type, the line width of the common electrode and the pixel electrode formed in the cell area may be reduced from the related art line width of 4 μm down to 0.5~2 μm. Accordingly, the aperture ratio increases and the brightness improves in the liquid crystal display device. Hereinafter, the liquid crystal display device of horizontal electric field type using the method of forming a fine pattern according to embodiments of the present invention will be described.

Figure 4:
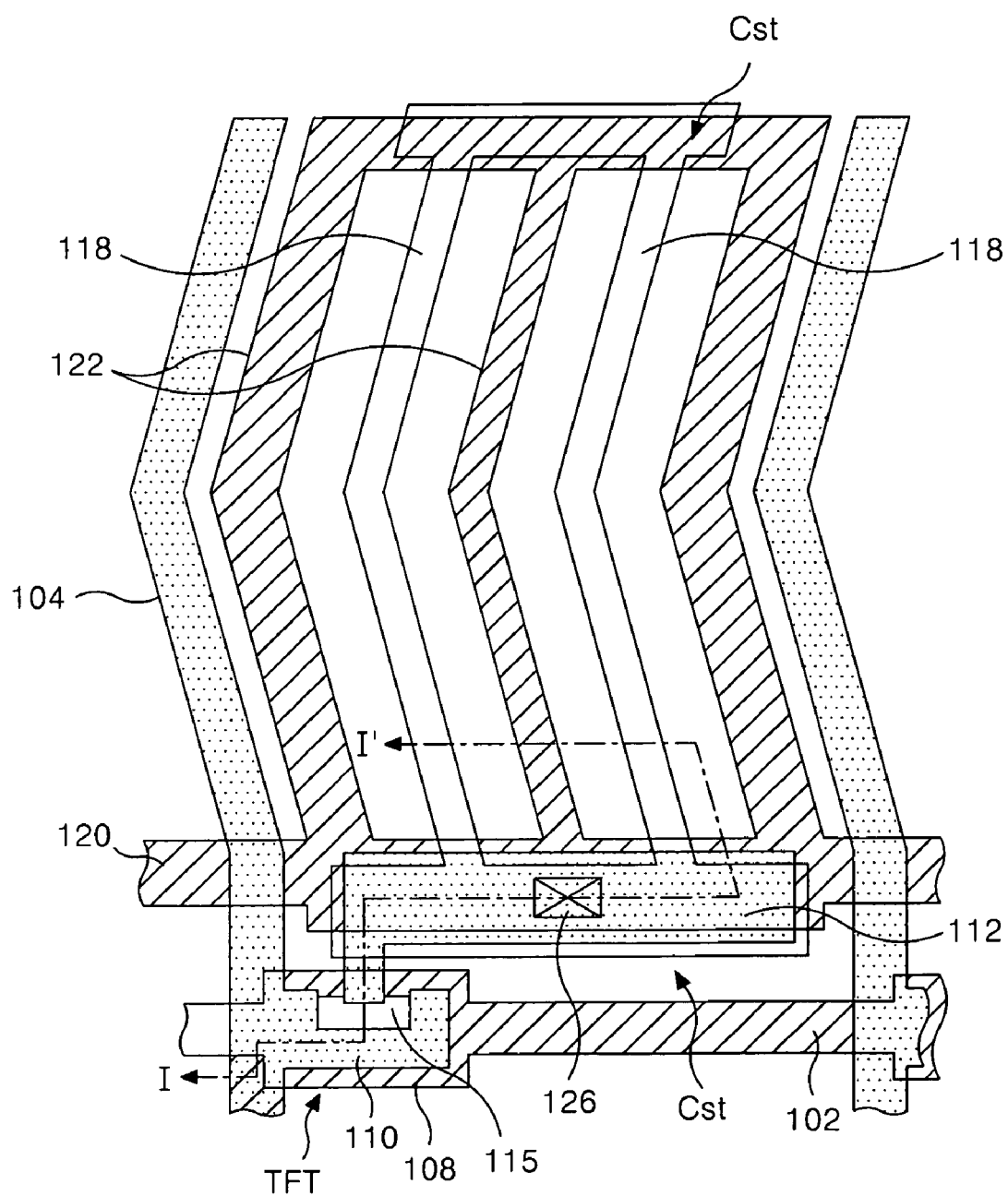
FIG. 4 is a plan view showing a thin film transistor substrate of a liquid crystal display device according to the embodiment of the present invention.
Figure 5:
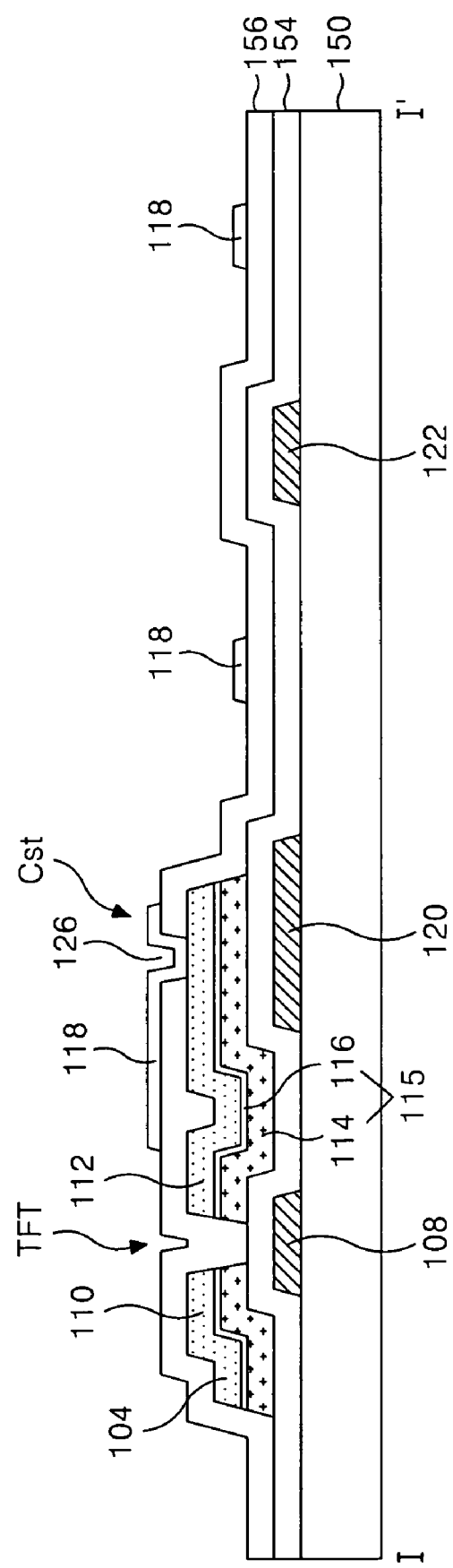
FIG. 5 is a cross-sectional view of the thin film transistor substrate taken along line I-I' in FIG. 4.

FIG. 4 is a plan view showing a thin film transistor substrate of a liquid crystal display device according to the embodiment of the present invention, and FIG. 5 is a cross-sectional view of the thin film transistor substrate taken along line I-I' in FIG. 4. Referring to FIG. 4 and FIG. 5, the thin film transistor substrate of horizontal electric field type includes a gate line 102 that supplies a scanning signal from a gate driver (not shown) while the data line 104 supplies a video signal from a data driver (not shown). The gate line 102 and the data line 104 cross each other with a gate insulating film 154 therebetween to define each cell area. A TFT is connected to the gate line 102, the data line 104, a pixel electrode 118 in each cell area. The common electrode 122 together with the pixel electrode 118 in each cell area is for forming a horizontal electric field. A common line 120 is connected to the common electrode 122 in each cell area. A storage capacitor Cst is connected to the pixel electrode 118 in each cell area.

The thin film transistor TFT applies a video signal from the data line 104 to the pixel electrode 118 in response to a scanning signal applied to the gate line 102. More specifically, the thin film transistor TFT includes a gate electrode connected to the gate line 102, a source electrode 110 connected to the data line 104, a drain electrode 112 positioned opposite to the source electrode 110 and connected to a pixel electrode 118, an active layer 114 overlapping the gate electrode 108 with the gate insulating film 154 therebetween to define a channel between the source electrode 110 and the drain electrode 112, and ohmic contact layers 116 for forming ohmic contacts with the active layer 114 to the source electrode 110 and the drain electrode 112. Further, the semiconductor pattern 115 includes the active layer 114 and one of the ohmic contact layers 116 overlapping the common line 120.

The common line 120 supplies, via the common electrode 122, a reference voltage for driving the liquid crystal, that is, a common voltage to each pixel. A finger portion of common electrode 122 protrudes into the cell area from the common line 120 and is formed in parallel to a finger portion of the pixel electrode 118, and a horizontal portion is commonly connected to the finger portion and another finger portion of the common electrode 120. For example, as shown in FIG. 4, the common electrode 122 and a finger portion of the pixel electrode 118 may be formed in a zigzag manner along with the data line 104. In the alternative, the finger portions of the common electrode 122 and the pixel electrode 118 may be formed in the stripe manner along with the data line 104.

The pixel electrode 118 includes a finger portion in parallel to a finger portion of the common electrode 122, a first horizontal portion connected to the finger portion and overlapping the drain electrode 112, and a second horizontal portion overlapping the horizontal portion of the common electrode 122. A first horizontal portion of the pixel electrode 118 is connected, via a contact hole 126 passing through a protective film 156, to the drain electrode 112. If a video signal is applied, via the thin film transistor, to the pixel electrode 118, then a horizontal electric field is formed between the finger portion of the pixel electrode 118 and the finger portion of the common electrode 122 supplied with the common voltage. Liquid crystal molecules arranged in the horizontal direction between the thin film transistor array substrate and the color filter array substrate are rotated by such a horizontal electric field due to dielectric anisotropy of the liquid crystal molecules. The amount of light transmittance through the cell area is differentiated depending upon a rotation extent of the liquid crystal molecules, thereby implementing a gray level scale.

A portion of the storage capacitor Cst is provided by the common electrode 120 overlapping the drain electrode 112 with the gate insulating film 154 and the semiconductor pattern 115 therebetween. Another position of the storage capacitor Cst is between the horizontal portions of the pixel and common electrodes. The storage capacitor Cst allows a video signal charged onto the pixel electrode 118 to be stably maintained until the next signal is charged.

A method of fabricating a thin film transistor substrate having such configuration will now be described. A first conductive pattern group, including the gate line 102, the gate electrode 122, the common line 120 and the common electrode 122, is formed by patterning after a first conductive layer is formed on a substrate 150. After the gate insulating film 154, a semiconductor layer and a second conductive layer are disposed, the semiconductor layer and the second conductive layer are patterned, thereby providing the semiconductor pattern 115, including the active layer 114 and the ohmic contact layer 116, and a second conductive pattern, group including the data line 104, the source electrode 110 and the drain electrode 112, overlapping the semiconductor pattern 115. In the alternative, the semiconductor pattern 115 and the second conductive pattern group may be provided by using separate masking processes.

Next, the protective film 156 is formed and patterned, thereby providing the contact hole 126 in the protective film 156. A transparent conductive layer is then formed and patterned on the protective film 156, thereby providing the pixel electrode 118. In the alternative, both the common electrode 122 and the pixel electrode 118 may be formed of a transparent conductive layer on the protective film 156. In this case, the common electrode 122 is connected, via a contact hole passing through the protective film 156 and the gate insulating film 154, to the common line 120.

In the method of fabricating such thin film transistor substrate, at least one of the common electrode 122 and the pixel electrode 118 is formed by the method of forming a fine pattern according to an embodiment of the present invention. In this case, at least one of the common electrode 122 and the pixel electrode 118, that is, a finger portion line width of the electrode is reduced from a related art line width of 4 μm down to 0.5~2 μm, so that brightness is improved. Hereinafter, only an explanation will be described in detail for the finger portions of pixel electrode 118 being formed by the method of forming a fine pattern according to an embodiment of the present invention. Of course, the finger portions of the common electrode 122 can also be formed by the method of forming a fine pattern according to an embodiment of the present invention.

Figure 6A:
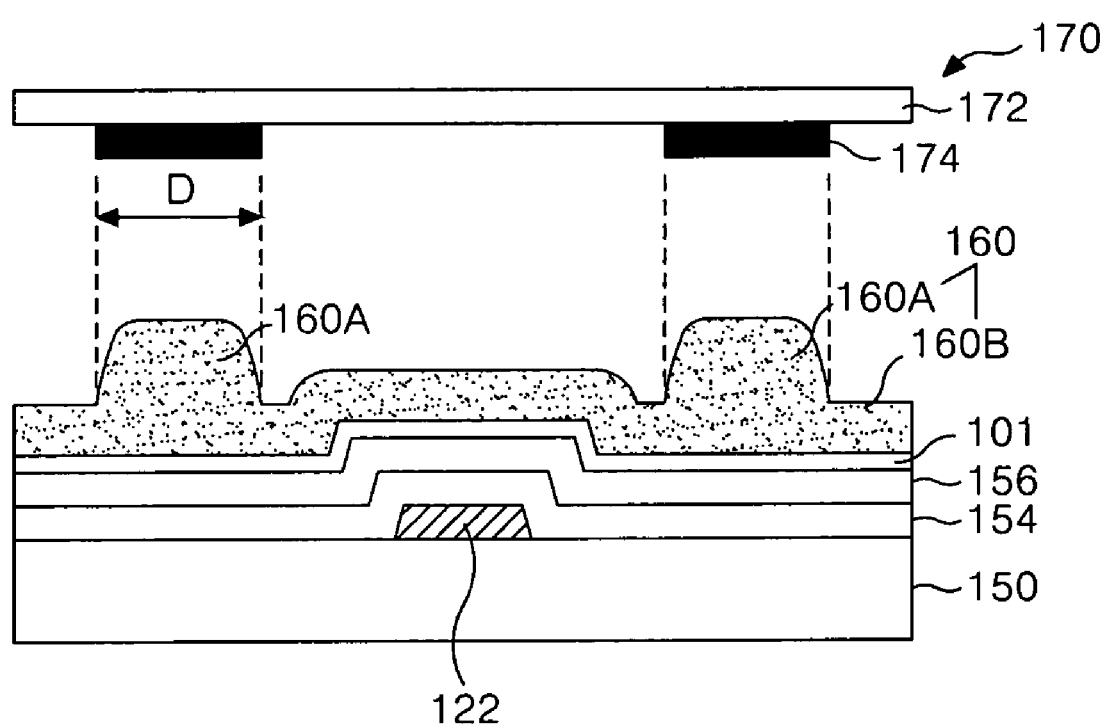
FIG. 6A to FIG. 6D are cross-sectional views showing the method of forming the pixel electrode in FIG. 5.

Referring to FIG. 6A, the transparent conductive layer 101 is formed on the substrate 150 having the common electrode 122, the gate insulating film 154 and the protective film 156 disposed thereon. Then, a photo-resist pattern 160 having a step pattern, i.e, a step coverage is formed on the transparent conductive layer 101 by a deposition method, such as sputtering. The photo-resist is developed and baked (or hardened) after a photo-resist is formed on the protective film 156, and a shielding area 174 of a mask 170 is transposed onto the photo-resist by an exposing process, thereby providing the photo-resist pattern 160. The photo-resist pattern 160 has a step area 160A formed corresponding to the shielding area 174 of the mask 170, and a flat area 160B formed corresponding to the transmitting portion of a mask substrate 172. In such a photo-resist pattern 160, the step area 160A is for forming the pixel electrode 118, and the flat area 160B is additionally formed to maintain line width uniformity of the step area 160A in a subsequent ashing process. The flat area 160B has a thickness thinner than that of the step area 160A of the photo-resist pattern 160. The flat area 160B of the photo-resist pattern 160 is leftover due to the reduced exposure time of the exposing process.

Figure 6B:
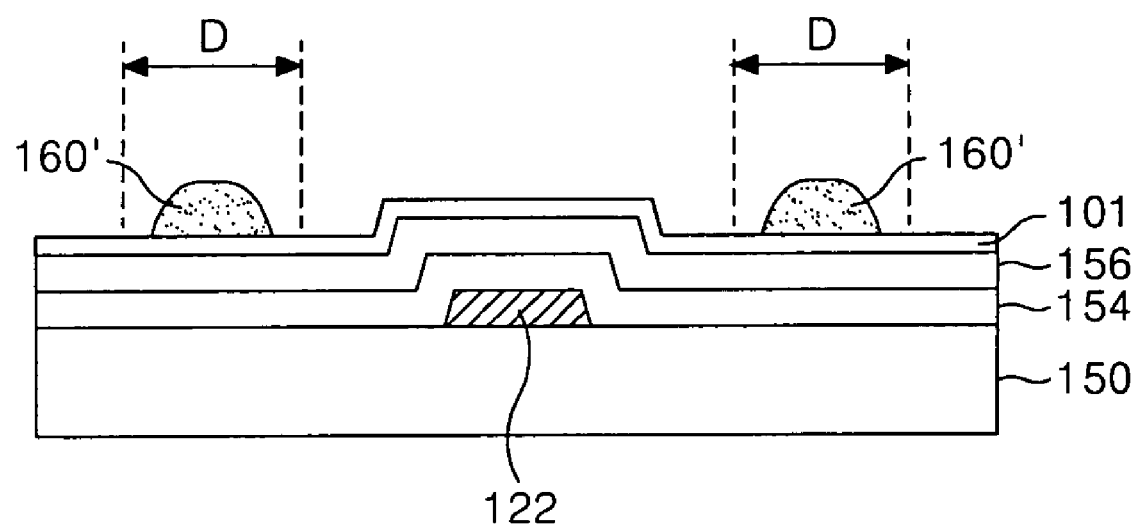

The shielding area 174 of the mask 170 forms the step area 160A of the photo-resist pattern 160 in FIG. 6A to later form the finger portion of the pixel electrode 118 in FIG. 5 with a line width corresponding to the resolution D of the shielding area 174. Referring to FIG. 6B, the flat area 160B of the photo-resist pattern 160 is removed while a thickness and a line width of the step area 160B of the photo-resist pattern 160 are reduced by the ashing process. The ashing process employs plasma, and if a related art vacuum apparatus is employed, an ashing gas employs $SF_6$ and $CF_4$ together with $O_2$. The remaining ashed photo-resist pattern 160' has a line width narrower than the exposure resolution D.

Figure 6C:
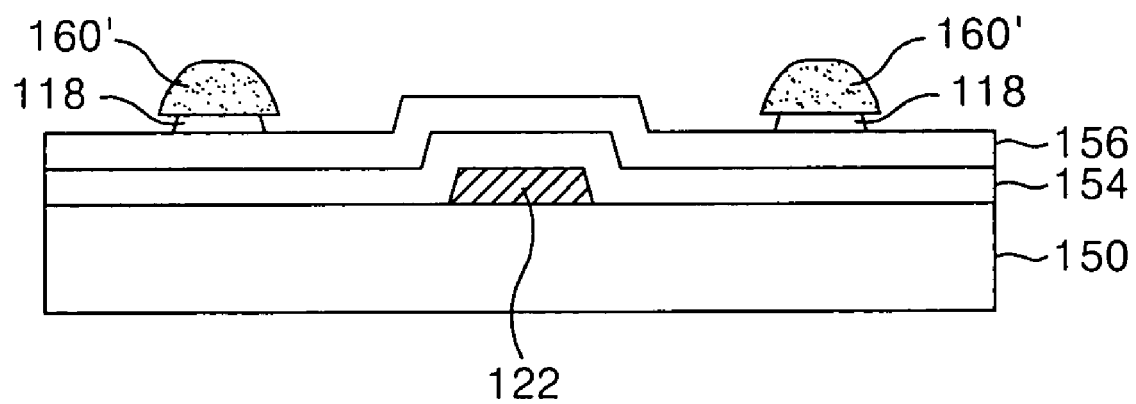
Figure 6D:
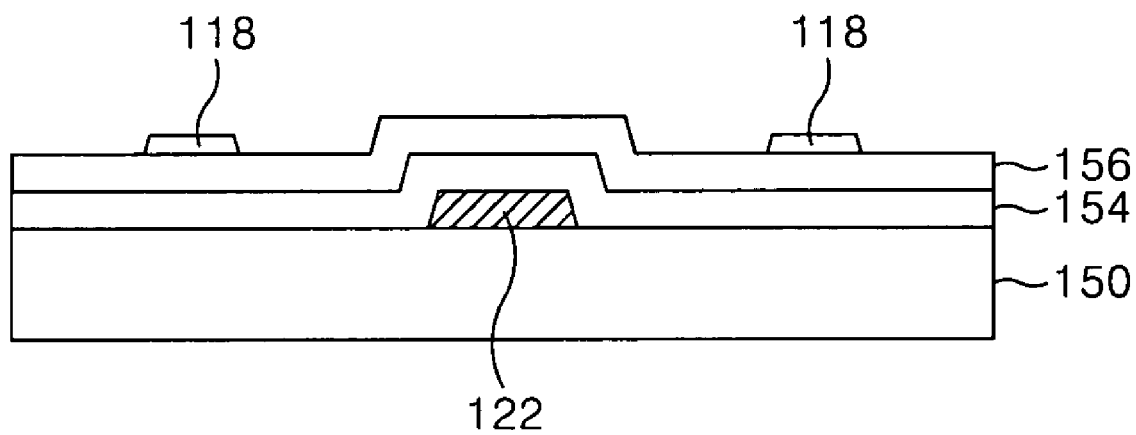

Referring to FIG. 6C and FIG. 6D, the transparent conductive layer 101 is then etched using the ashed photo-resist pattern 160' as a mask. The transparent conductive layer 101 is over-etched due to a characteristic of a wet-etching process, so that the pixel electrode 118 has a narrower line width than the line width of the ashed photo-resist pattern 160'. The finger portion of the pixel electrode shown in FIG. 6D is formed in such a manner as to have a narrower line width, that is, approximately 0.5~2 μm, than an exposure resolution D of the shielding area 174 of the mask 170, which is approximately 4 μm.

Figure 7A:
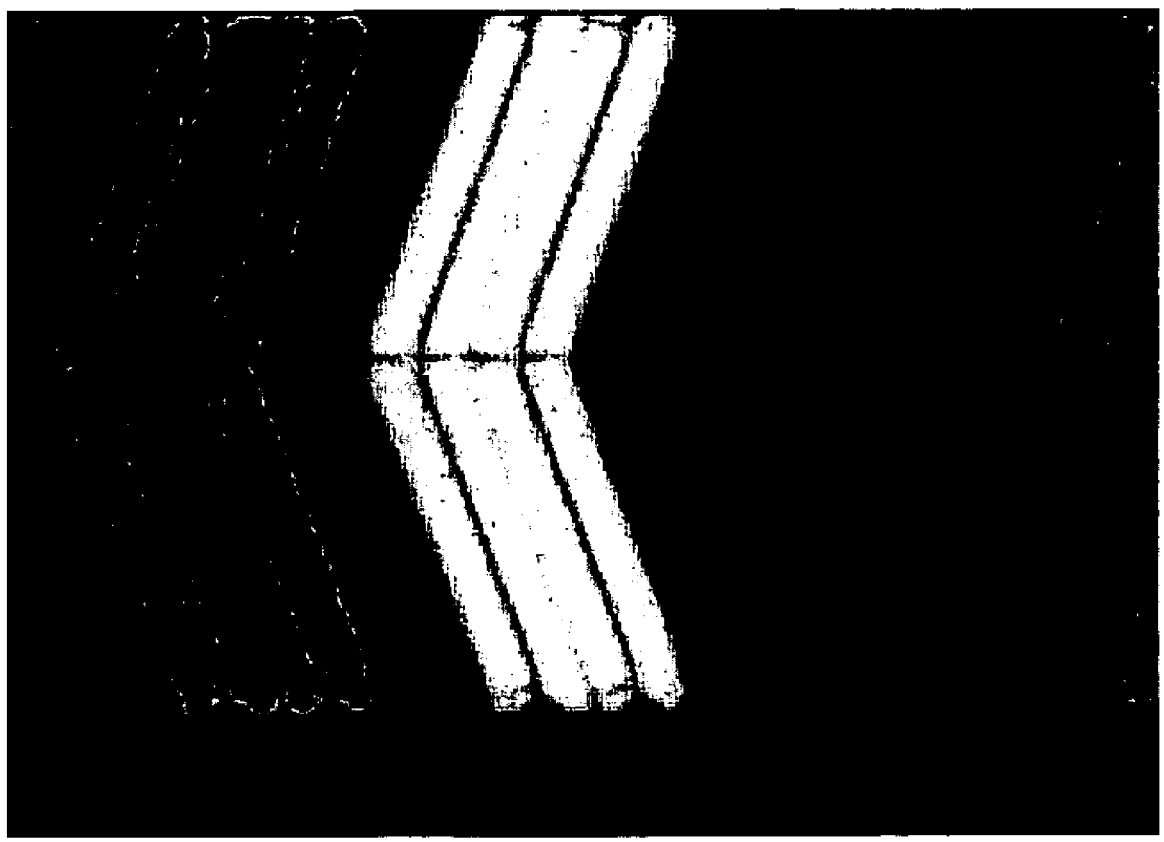
FIG. 7A is an illustration showing a brightness of a related art liquid crystal display device of horizontal electric field type with a pixel electrode having a 4 μm line width.
Figure 7B:
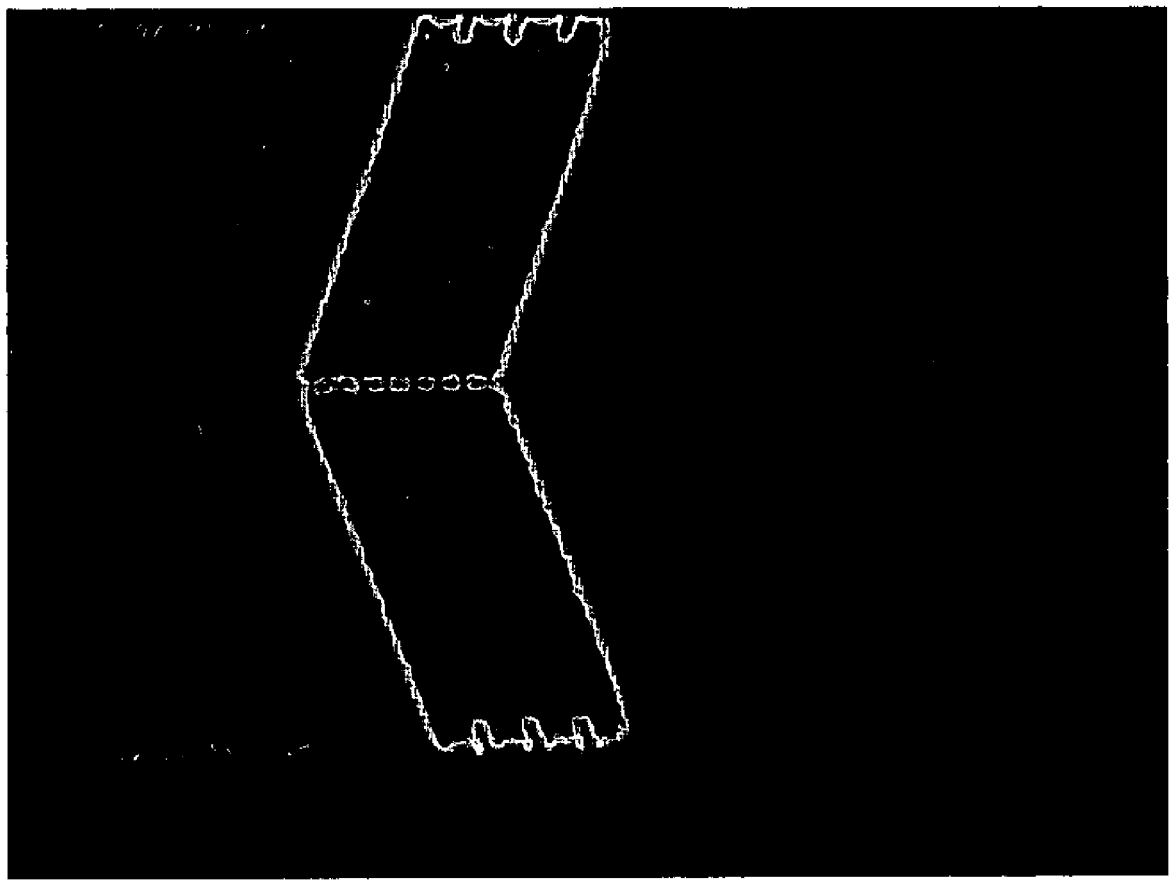
FIG. 7B is an illustration showing a brightness of a liquid crystal display device of horizontal electric field type according to an embodiment of the present invention with a pixel electrode having a 1 μm line width.

On the other hand, if a horizontal electric field is formed by the pixel electrode 118 and the common electrode 122, then an area of liquid crystal molecules positioned inwardly about 0.8 μm from each side edge portion of a transparent pixel electrode 118 finger portion is affected by the horizontal electric field. Thus, these liquid crystal molecules are driven so as to contribute to the brightness of the liquid crystal display. Accordingly, the entire pixel electrode 118 finger portion can contribute to transmitting light at a line width of approximately 1.6 μm. On the other hand, if a line width of the finger portion of the pixel electrode 118 is more than 1.6 μm, a middle portion, which is more than 0.8 μm from a side, is not affected by the horizontal electric field and thus does not contribute to improving brightness. Liquid crystal molecules are not properly driven over an electrode having a line width greater than 1.6 μm. Such improperly driven liquid crystal molecules can cause light leakage. Accordingly, the finger portion of the pixel electrode 118 is formed in such a manner as to have a line width of less than 1.6 μm to prevent light leakage. Likewise, the finger portion of the common electrode 122 is formed in such a manner as to have a line width of less than 1.6 μm to prevent light leakage FIG. 7A is an illustration showing a brightness of a related art liquid crystal display device of horizontal electric field type with a pixel electrode having a 4 μm line width, and FIG. 7B is an illustration showing a brightness of a liquid crystal display device of horizontal electric field type according to an embodiment of the present invention with a pixel electrode having a 1 μm line width. In the LCD having a pixel electrode with 4 μm line width, as shown in FIG. 7A, a middle portion thereof shields light while an LCD having a pixel electrode with 1 μm line width transmits more light, as shown in FIG. 7B. As described above, a method of forming a fine pattern according to embodiments of the present invention creates a fine pattern having a narrower line width than the exposure resolution by an ashing process of the photo-resist pattern. Also, a photo-resist pattern having a step pattern, i.e., a step coverage is formed to maintain line width uniformity of the fine pattern. Because the exposure time is reduced to provide the photo-resist pattern having step pattern, i.e., a step coverage, manufacturing costs are reduced and productivity is increased by the shortened processing time. Also, a liquid crystal display device of horizontal electric field type and a fabricating method thereof according to the present invention, at least one of a common electrode and a pixel electrode is formed in such a manner to have a 0.5~2 μm line width by the method of forming a fine pattern to increase aperture ratio and improve brightness.

Although the present invention has been explained by the embodiments shown in the drawings described above, it should be understood to the ordinary skilled person in the art that the invention is not limited to the embodiments, but rather that various changes or modifications thereof are possible without departing from the spirit of the invention. Accordingly, the scope of the invention shall be determined only by the appended claims and their equivalents.

What is claimed is:

1. A method of forming a fine pattern, comprising:
providing a film;
forming a photo-resist pattern on the film;
ashing the photo-resist pattern, wherein the ashing process is performed under $O_2$ and at least one of $SF_6$ and $CF_4$ gas environment; and
patterning the film by using the ashed photo-resist pattern as a mask.

2. The method as claimed in claim 1, wherein the photo-resist pattern has a step pattern.

3. The method as claimed in claim 1, wherein the photo-resist pattern includes a first region and a second region having a thickness thinner than the first region.

4. The method as claimed in claim 1, wherein the ashing the photo-resist pattern includes reducing a line width and a thickness of the first region, and removing the second region.

5. The method as claimed in claim 4, wherein the line width of the ashed first region includes a uniform width by removing the second region of the photo-resist pattern and adjusting a condition of the ashing process.

6. The method as claimed in claim 1, wherein the forming the photo-resist pattern includes an exposing process adjusting an exposure time such that the photo-resist pattern remains in an exposed area.

7. The method as claimed in claim 1, wherein the photo-resist pattern includes a step region and a flat region.

8. The method as claimed in claim 7, wherein the step region is shielded during the exposing process and the flat region is exposed during the exposure process.

9. The method as claimed in claim 1, wherein the ashing process is performed by using plasma.

10. The method as claimed in claim 1, wherein the fine pattern has a line width of approximately 0.5~2 μm.

11. A method of forming a fine pattern, comprising:
forming a photo-resist pattern using a mask to form a first pattern having a first line width corresponding to an exposure resolution of the mask;
ashing the photo-resist pattern to have a second pattern with a second line width narrower than the first line width, wherein the ashing process is performed by $O_2$ and at least one of $SF_6$ and $CF_4$ gas environment; and
patterning a film by using the ashed photo-resist pattern as a mask to form a third pattern with a third line width narrower than the second line width.

12. The method as claimed in claim 11, wherein the photo-resist pattern has a step pattern.

13. The method as claimed in claim 11, wherein the photo-resist pattern includes a first region and a second region having a thickness thinner than the first region.

14. The method as claimed in claim 13, wherein ashing the photo-resist pattern includes reducing a line width and a thickness of the first region, and removing the second region.

15. The method as claimed in claim 13, wherein the line width of the ashed first region includes a uniform width by removing the second region of the photo-resist pattern and adjusting a condition of the ashing process.

16. The method as claimed in claim 11, wherein the forming the photo-resist pattern includes an exposing process adjusting an exposure time such that the photo-resist pattern remains in an exposed area.

17. The method as claimed in claim 11, wherein the photo-resist pattern includes a step region and a flat region.

18. The method as claimed in claim 17, wherein the step region is shielded during the exposing process and the flat region is exposed during the exposure process.

19. The method as claimed in claim 11, wherein the ashing process is performed by using plasma.

20. The method as claimed in claim 11, wherein the fine pattern has a line width of approximately 0.5~2 μm.

21. A method of fabricating at least one portion of the pixel electrode and the common electrode on a substrate for a liquid crystal display device comprising:
forming a conductive layer;
forming a photo-resist pattern using a mask to form a first pattern having a first line width corresponding to an exposure resolution of the mask;
ashing the photo-resist pattern, wherein the ashing process is performed under $O_2$ and at least one of $SF_6$ and $CF_4$ gas environment; and
patterning the conductive layer using the ashed photo-resist pattern as a mask to form the one portion having a second line width narrower than the first line width.

22. The method as claimed in claim 21, wherein the photo-resist pattern has a step pattern.

23. The method as claimed in claim 21, wherein the photo-resist pattern includes a first region and a second region having a thickness thinner than the first region.

24. The method as claimed in claim 23, wherein ashing the photo-resist pattern includes reducing a line width and a thickness of the first region, and removing the second region.

25. The method as claimed in claim 24, wherein the line width of the ashed first region includes a uniform width by removing the second region of the photo-resist pattern and adjusting a condition of the ashing process.

26. The method as claimed in claim 21, wherein the forming the photo-resist pattern includes an exposing process adjusting an exposure time such that the photo-resist pattern remains in an exposed area.

27. The method as claimed in claim 21, wherein the photo-resist pattern includes a step region and a flat region.

28. The method as claimed in claim 27, wherein the step region is shielded during the exposing process the flat region is exposed during the exposure process.

29. The method as claimed in claim 21, wherein the ashing process is performed by using plasma.

30. The method as claimed in claim 21, wherein the one portion has a line width of approximately 0.5~2 μm.

31. The method as claimed in claim 21, wherein the one portion has a line width of approximately 1 μm.

32. The method as claimed in claim 21, wherein the one portion is a finger portion of the at least electrode.

* * * * *